(12) United States Patent
Damphousse

(10) Patent No.: US 10,879,913 B2
(45) Date of Patent: Dec. 29, 2020

(54) PHASED LOCKED LOOP INTEGRATED CIRCUIT

(71) Applicant: TEXAS INSTRUMENTS INCORPORATED, Dallas, TX (US)

(72) Inventor: Simon Jacques Damphousse, Bellevue, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/735,733

(22) Filed: Jan. 7, 2020

(65) Prior Publication Data

US 2020/0145014 A1    May 7, 2020

Related U.S. Application Data

(63) Continuation of application No. 15/971,808, filed on May 4, 2018, now Pat. No. 10,560,109.
(Continued)

(51) Int. Cl.
| | |
|---|---|
| *H03L 7/07* | (2006.01) |
| *H03L 7/22* | (2006.01) |
| *H03L 7/10* | (2006.01) |
| *H03L 7/099* | (2006.01) |
| *H03L 7/08* | (2006.01) |
| *H03L 7/18* | (2006.01) |

(52) U.S. Cl.
CPC .............. *H03L 7/104* (2013.01); *H03L 7/07* (2013.01); *H03L 7/0805* (2013.01); *H03L 7/0992* (2013.01); *H03L 7/18* (2013.01); *H03L 7/22* (2013.01); *H03L 2207/06* (2013.01)

(58) Field of Classification Search
CPC ..... H03L 7/00; H03L 7/06; H03L 7/07; H03L 7/08; H03L 7/0805; H03L 7/0992; H03L 7/101; H03L 7/104; H03L 7/141; H03L 7/143; H03L 7/145; H03L 7/18; H03L 7/22; H03L 2207/06
See application file for complete search history.

(56) References Cited

U.S. PATENT DOCUMENTS

| 5,386,437 A | 1/1995 | Yasuda |
| 5,446,416 A | 8/1995 | Lin et al. |
| (Continued) | | |

*Primary Examiner* — Levi Gannon
(74) *Attorney, Agent, or Firm* — Ray A. King; Charles A. Brill; Frank D. Cimino

(57) ABSTRACT

An integrated circuit includes phase locked loop (PLL) circuitry, voltage controlled oscillator (VCO) circuitry, and interface circuitry. The PLL circuitry includes a reference signal input terminal, a reference frequency divider circuit, a reference signal output terminal, a switch, a phase detector, a charge pump, and a control voltage output terminal. The reference frequency divider circuit is coupled to the reference signal input terminal. The switch is coupled to the reference frequency divider circuit and to the reference signal output terminal. The switch is configured to switchably connect the reference frequency divider circuit to the reference signal output terminal. The VCO circuitry includes a control voltage input terminal, a VCO, calibration circuitry, and a calibration input/output (I/O) terminal. The VCO is coupled to the control voltage input terminal. The calibration circuitry is coupled to the VCO. The calibration I/O terminal is coupled to the calibration circuitry.

13 Claims, 4 Drawing Sheets

Related U.S. Application Data

(60) Provisional application No. 62/611,796, filed on Dec. 29, 2017.

(56) References Cited

U.S. PATENT DOCUMENTS

| | | | |
|---|---|---|---|
| 5,610,558 | A | 3/1997 | Mittel et al. |
| 5,929,711 | A | 7/1999 | Ito |
| 6,088,311 | A | 7/2000 | Katoh |
| 6,236,697 | B1 | 5/2001 | Fang |
| 9,225,507 | B1 | 12/2015 | Lye et al. |
| 2003/0091138 | A1 | 5/2003 | Tagami |
| 2003/0128782 | A1 | 7/2003 | Novak et al. |
| 2005/0104665 | A1 | 5/2005 | Molnar et al. |
| 2005/0184810 | A1 | 8/2005 | Oba et al. |
| 2006/0030285 | A1* | 2/2006 | Ghazali ............. H03L 7/0996 455/260 |
| 2012/0242415 | A1 | 9/2012 | Tsuda |
| 2016/0269033 | A1 | 9/2016 | Saito |

* cited by examiner

PHASED LOCKED LOOP INTEGRATED CIRCUIT

CROSS-REFERENCE TO RELATED APPLICATIONS

This continuation application claims priority to U.S. patent application Ser. No. 15/971,808, filed May 4, 2018, which application claims the benefit of and priority to U.S. Provisional Patent Application No. 62/611,796, filed Dec. 29, 2017, both of which are hereby incorporated herein by reference in their entirety.

BACKGROUND

The phase locked loop (PLL) is a building block for a wide variety of electronic devices. A PLL is a phase feedback system that includes a phase detector, a low-pass filter and a voltage-controlled oscillator (VCO) in the feedback path. When there is no reference signal to the loop the voltage-controlled oscillator operates at a free-running frequency. If a reference signal is applied, usually by a crystal controlled oscillator, the phase detector compares the phase and frequency of the input reference with the signal of the VCO, of signal produced therefrom by division, and generates an error voltage that is related to the difference in the two signals. The error voltage is then filtered and applied to the control of the VCO thereby varying the VCO frequency in a direction that reduces the frequency difference between the two signals. When the frequencies of the two signals become sufficiently close, the negative feedback nature of the system causes the system to lock with the incoming signal. Once in lock, the VCO frequency and phase is aligned with the frequency of the reference signal, except for a finite phase difference which is necessary to generate the corrective error voltage to shift the VCO frequency to the input signal frequency, thus keeping the system in lock.

SUMMARY

An integrated circuit for use in oscillators that provide reduced spurious signal amplitude are in disclosed herein. In a first example, an integrated circuit includes phase locked loop (PLL) circuitry, voltage controlled oscillator (VCO) circuitry, and interface circuitry. The PLL circuitry includes a reference signal input terminal, a reference frequency divider circuit, a reference signal output terminal, a switch, a phase detector, a charge pump, and a control voltage output terminal. The reference frequency divider circuit is coupled to the reference signal input terminal. The switch is coupled to the reference frequency divider circuit and to the reference signal output terminal. The switch is configured to switchably connect the reference frequency divider circuit to the reference signal output terminal. The phase detector is coupled to the reference frequency divider circuit. The charge pump is coupled to the phase detector. The control voltage output terminal is coupled to the charge pump. The VCO circuitry includes a control voltage input terminal, a VCO, calibration circuitry, and a calibration input/output (I/O) terminal. The VCO is coupled to the control voltage input terminal. The calibration circuitry is coupled to the voltage controlled oscillator. The calibration I/O terminal is coupled to the calibration circuitry. The interface circuitry includes a calibration control output terminal.

In another example, an oscillator system includes a first integrated circuit and a second integrated circuit. The second integrated circuit and the first integrated circuit include the same circuitry. Each of the first integrated circuit and the second integrated circuit includes PLL circuitry, VCO circuitry, and interface circuitry. The PLL circuitry of the first integrated circuit is coupled to the voltage controlled oscillator circuitry of the second integrated circuit. The interface circuitry of the first integrated circuit controls calibration of the VCO circuitry of the second integrated circuit.

In a further example, an oscillator system includes a first integrated circuit and a second integrated circuit. The second integrated circuit and the first integrated circuit include the same circuitry. Each of the first integrated circuit and the second integrated circuit includes PLL circuitry and VCO circuitry. The PLL circuitry includes a reference frequency input terminal, a reference frequency divider circuit; a reference signal output terminal; and a switch. The switch is configured to switchably connect an output of the reference frequency divider circuit to the reference signal output terminal. The PLL circuitry of the first integrated circuit is coupled to the voltage controlled oscillator circuitry of the second integrated circuit. The reference signal output terminal of the first integrated circuit is coupled to the reference frequency input terminal of the second integrated circuit.

BRIEF DESCRIPTION OF THE DRAWINGS

For a detailed description of various examples, reference will now be made to the accompanying drawings in which.

DETAILED DESCRIPTION

Figure 1:
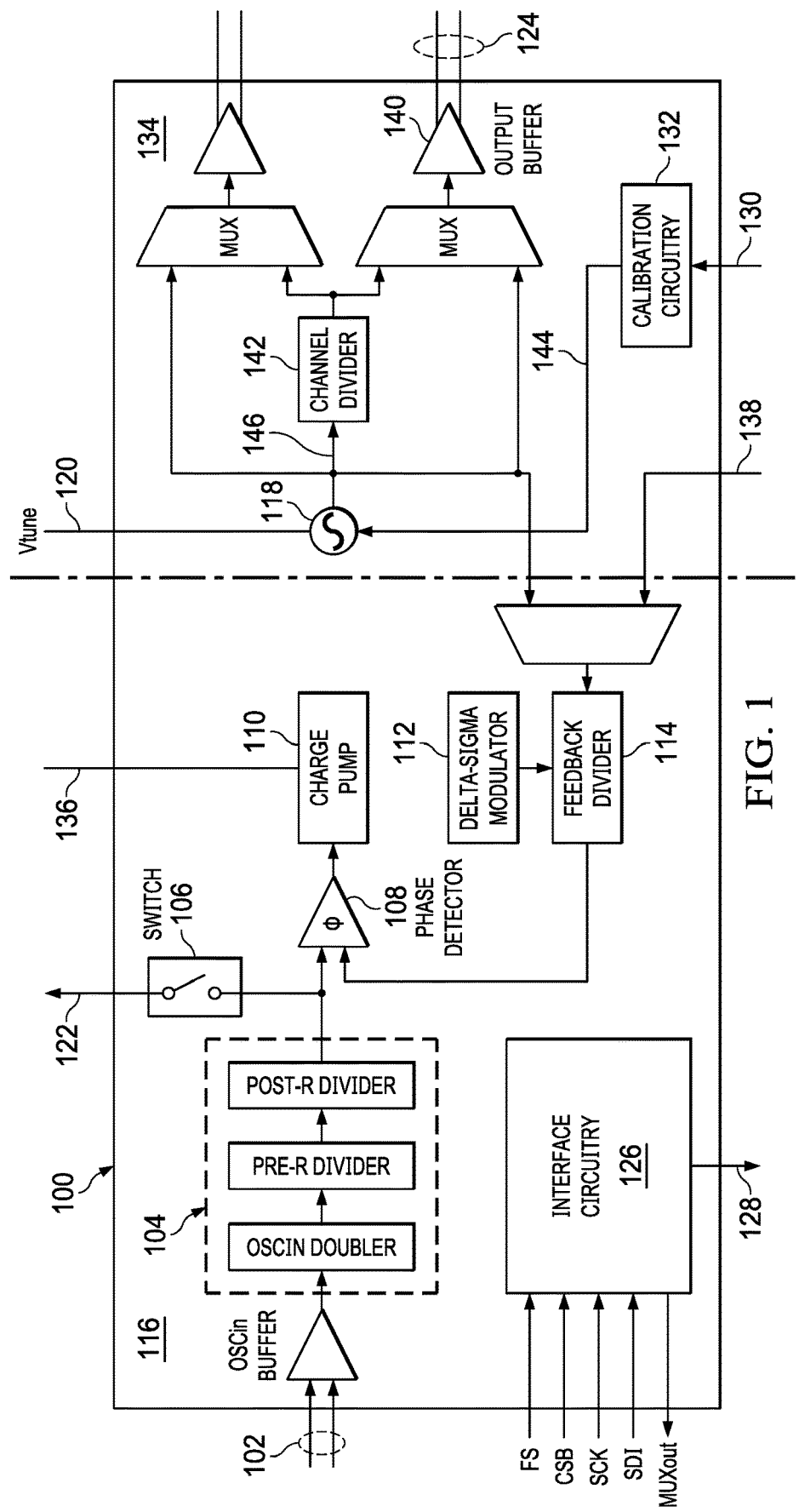
FIG. 1 shows a block diagram for a phase lock loop (PLL)/voltage controlled oscillator (VCO) integrated circuit that reduces spurious tones in accordance with various examples.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

While phase locked loops (PLLs) are widely used and provide a flexible means of frequency generation, oscillator circuits that employ PLLs are not without issue. Fractional PLLs enable a high frequency resolution step and improved lock time while keeping the phase detector frequency high to insure lower in band noise, but introduce spurious tones that must be carefully managed.

VCO frequency range depends on a variety of factors related to required performance and technology. Wider frequency range VCOs typically exhibit reduced performance with respect to phase noise. Some integrated circuits include a multi core VCO with coarse tuning to allow the integrated circuit to cover a large frequency range while reducing phase noise. Such integrated circuits include both PLL and VCO to allow seamless coarse adjustments and calibration. However, such integrated circuits suffer from relatively low isolation between the PLL and VCO that increases cross coupling of undesired signals between the circuits through substrate, bonding wires, and/or packaging. Such cross coupling is a significant source of spurious tones that limit the performance of the integrated circuit. In some cases the spurious tones cannot be filtered and limit the performance of the integrated circuit.

Implementations of the present disclosure include an integrated circuit that reduces the spurious tones in a PLL oscillator circuit, which in turn improves overall circuit performance. The integrated circuit disclosed herein includes PLL circuitry and VCO circuitry on a same die. The PLL and VCO circuitry allow two instances of the integrated circuit to be interconnected such that one instance of the integrated circuit implements the PLL functionality and another instance of the integrated circuit implements the VCO functionality. Control and calibration of the two instances of the integrated circuit are provided via a control interface of one of the two integrated circuits. Thus, an oscillator implemented using two of the integrated circuits provides spatial isolation between the VCO and PLL circuitry, which reduces cross coupling and spurious tones, while allowing the oscillator to be calibrated and controlled via a single interface.

FIG. 1 shows a block diagram for a PLL/VCO integrated circuit 100 that reduces spurious tones in accordance with various examples. The PLL/VCO integrated circuit 100 includes PLL circuitry 116, VCO circuitry 134, and interface circuitry 126. The interface circuitry 126 includes communication circuitry that allows the PLL/VCO integrated circuit 100 to communicate with external devices and systems. In various implementations, communication is serial, parallel, unidirectional or bi-directional, and compliant with any of a variety of standards. For example, in various examples, the interface circuitry 126 includes circuitry to implement serial communication in compliance with the Inter-Integrated Circuit standard, the serial peripheral interface standard, etc. The PLL/VCO integrated circuit 100 includes a calibration control output terminal 128 through which calibration information received by the interface circuitry 126 and/or other information is communicated to a device (e.g., another instance of the PLL/VCO integrated circuit 100) external to the PLL/VCO integrated circuit 100.

The PLL circuitry 116 includes a reference signal input terminal 102, a reference frequency divider circuit 104, a calibration reference switch 106, a reference signal output terminal 122, a phase detector 108, a charge pump 110, a feedback divider 114, and a delta-sigma modulator 112. The reference signal input terminal 102 includes a conductive structure (e.g., a pin, pad, or ball) for connecting the PLL/VCO integrated circuit 100 to an external reference signal source, such as a crystal oscillator. The reference signal input terminal 102 is coupled to the reference frequency divider circuit 104. The reference frequency divider circuit 104 includes circuits to multiply and or divide the frequency of the reference signal received via the reference signal input terminal 102. In some implementations, the various multiplier and/or divisor values applied by the reference frequency divider circuit 104 are programmable via the interface circuitry 126.

The calibration reference switch 106 and the phase detector 108 are coupled to the output of the reference frequency divider circuit 104. The calibration reference switch 106 switchably connects the output of the reference frequency divider circuit 104 to the reference signal output terminal 122. The reference signal output terminal 122 includes a conductive structure (e.g., a pin, pad, or ball) for connecting the output of the frequency divider circuit 104 to an external device. In some implementations, the calibration reference switch 106 is closed during calibration of VCO circuitry of an instance of the PLL/VCO integrated circuit 100 that is external to the PLL/VCO integrated circuit 100, thereby providing the reference signal output of the reference frequency divider circuit 104 to the external instance of the PLL/VCO integrated circuit 100 for use in VCO calibration. Similarly, the calibration reference switch 106 is opened when VCO calibration is complete. Opening and closing of the calibration reference switch 106 is controlled by information received via the interface circuitry 126. For example, when information received via the interface circuitry 126 indicates that calibration is to be initiated, the interface circuitry 126 closes the calibration reference switch 106 to connect the reference signal output of the reference frequency divider circuit 104 to the reference signal output terminal 122.

The phase detector 108 compares the reference signal output of the reference frequency divider circuit 104 to the feedback signal output of the feedback divider 114. The output of the phase detector 108 represents phase/frequency error of the feedback signal output of the feedback divider 114 relative to the reference signal output of the reference frequency divider circuit 104. The error signal generated by the phase detector 108 drives the charge pump 110. The charge pump 110 produces, based on the error signal received from the phase detector 108, a voltage used to drive the VCO circuitry 134 via an external, internal, or partially integrated low-pass filter connected to the charge pump output terminal 136 (also referred to herein a control voltage output terminal 136) and the VCO control voltage input terminal 120. The output of the charge pump 110 is coupled to a charge pump output terminal charge pump output terminal 136. The charge pump output terminal 136 includes a conductive structure (e.g., a pin, pad, or ball) for connecting the charge pump 110 to a circuit, such as a low pass filter.

The feedback divider 114 divides the output of the VCO circuitry 134 by a programmable value set via the interface circuitry 126. The output of the VCO circuitry 134 is received via a feedback input terminal 138 in cases where the VCO circuitry 134 is external to the PLL/VCO integrated circuit 100. The feedback input terminal 138 includes a conductive structure (e.g., a pin, pad, or ball) for connecting the feedback divider 114 to an external device. The delta-sigma modulator 112 changes the divisor applied by the feedback divider 114 to allow for non-integer division by the feedback divider 114.

The VCO circuitry 134 includes a VCO 118, a VCO control voltage input terminal 120, and a VCO output terminal 124. The VCO control voltage input terminal 120 includes a conductive structure (e.g., a pin, pad, or ball) for connecting the VCO 118 to a control voltage source (e.g., via a low pass filter). The VCO output terminal 124 includes a conductive structure (e.g., a pin, pad, or ball) for connecting the output of the VCO 118 an external device. The VCO 118 is coupled to the VCO output terminal 124 via driver 140. Some implementations of the VCO 118 include multiple VCOs that are selectable to provide a signal output of the VCO 118 based, for example, on a selected frequency to be output by the VCO 118. The VCO 118 is also coupled to the VCO control voltage input terminal 120, and the frequency of the output signal 146 generated by the VCO 118 is controlled by a control voltage (Vtune) received by the PLL/VCO integrated circuit 100 at the VCO control voltage input terminal 120.

The VCO circuitry 134 also includes the calibration circuitry 132. In some implementations, the calibration circuitry 132 is a component of the PLL circuitry 116, or a subsystem of the PLL/VCO integrated circuit 100 that is separate from the PLL circuitry 116 and the VCO circuitry 134. The calibration circuitry 132 adjusts the operation of the VCO 118 to produce a desired output frequency. For example, given a desired output frequency, the calibration circuitry 132 selects one of a plurality of VCOs to provide the output of the VCO 118. The calibration circuitry 132 compares the output frequency of the VCO 118 (e.g., each VCO of the plurality of VCOs with coarse adjustment applied) to a reference frequency received via the reference signal input terminal 102, and selects a capacitor to apply to the VCO 118. To select a capacitor for connection to the VCO 118, the calibration circuitry 132 disconnects the VCO 118 from the charge pump 110 so the frequency of the VCO 118 is not altered by control voltage generated by the charge pump 110. With VCO 118 disconnected from the charge pump 110, the calibration circuitry 132 compares (e.g., via the phase detector 108) the output frequency of the VCO 118 and the reference frequency received at the reference signal input terminal 102 and iteratively applies different capacitors (e.g., different values of capacitance) to the VCO 118 until a best frequency match is obtained. The VCO 118 includes a plurality of capacitors that are switchably connected to each of the plurality of VCOs of the VCO 118 to adjust the output frequency of the VCO 118. During the capacitor selection, the divisor applied to the reference frequency received at reference signal input terminal 102 is set to one in some implementations. The calibration circuitry 132 also adjusts the amplitude of output of the VCO 118 as part of VCO calibration.

Figure 4:
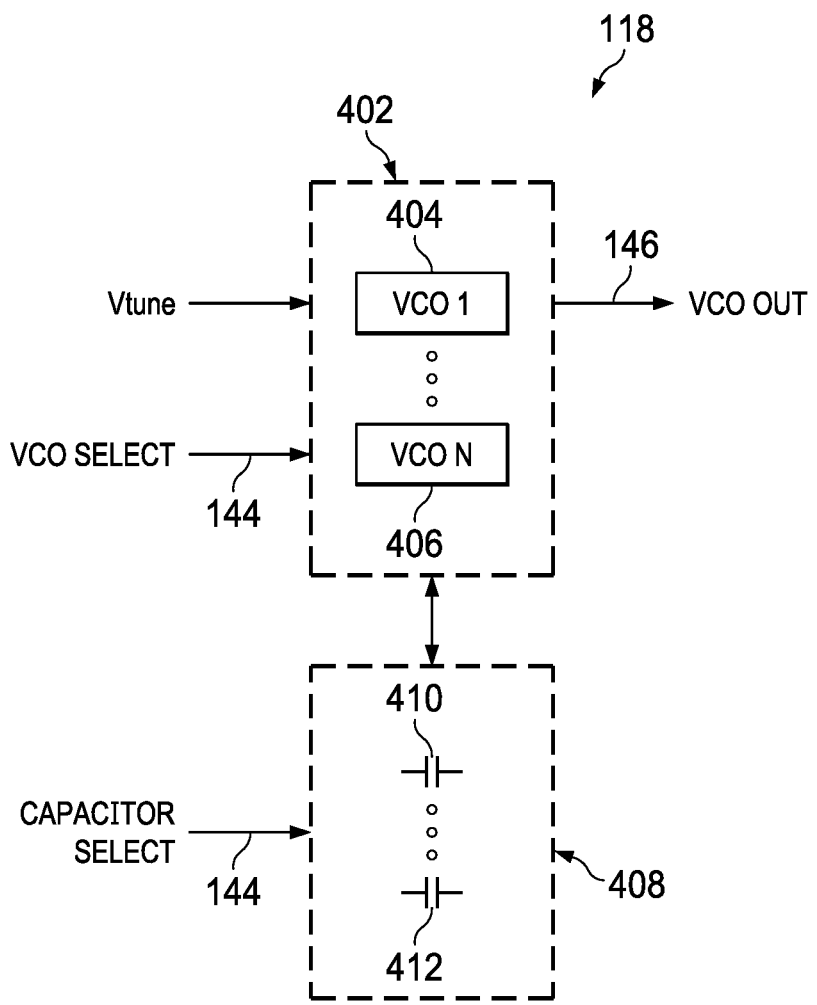
FIG. 4 shows a block diagram of a VCO suitable for use in a PLL/VCO integrated circuit in accordance with the present disclosure.

FIG. 4 shows a block diagram of an example of the VCO 118. The VCO 118 includes VCOs 402 and a capacitor bank 408. The VCOs 402 include a plurality of VCOs. For example, in FIG. 4, VCO 404 and VCO 406 are shown. Various implementations of the VCOs 402 include more than two VCOs. Calibration signals 144 include VCO selection signals that select one VCO of the VCOs 402 for operation.

The capacitor bank 408 is coupled to the VCOs 402. The capacitor bank 408 includes a plurality of capacitors. For example, in FIG. 4, capacitor 410 and capacitor 412 are shown. Various implementations of the capacitor bank 408 include more than two capacitors. One or more capacitors of the capacitor bank 408 may be selected for connection to a selected VCO (e.g., the VCO 404) to adjust the operating frequency of the selected VCO. Calibration signals 144 include capacitor selection signals that select one or more capacitors of the capacitor bank 408 for connection to the selected VCO.

Returning now to FIG. 1, the calibration circuitry 132 is connected to the calibration input/output (I/O) terminal 130. Calibration information is provided to the calibration circuitry 132 via the calibration I/O terminal 130. For example, in some implementations, the calibration I/O terminal 130 of PLL/VCO integrated circuit 100 is externally connected to the calibration control output terminal 128 of the same PLL/VCO integrated circuit 100 or a different PLL/VCO integrated circuit 100 for receipt of calibration information (such as desired frequency) received via the interface circuitry 126. Similarly, the calibration circuitry 132 provides calibration status (e.g., calibration complete) or other information to the interface circuitry 126 via the calibration I/O terminal 130 in some implementations.

Figure 2:
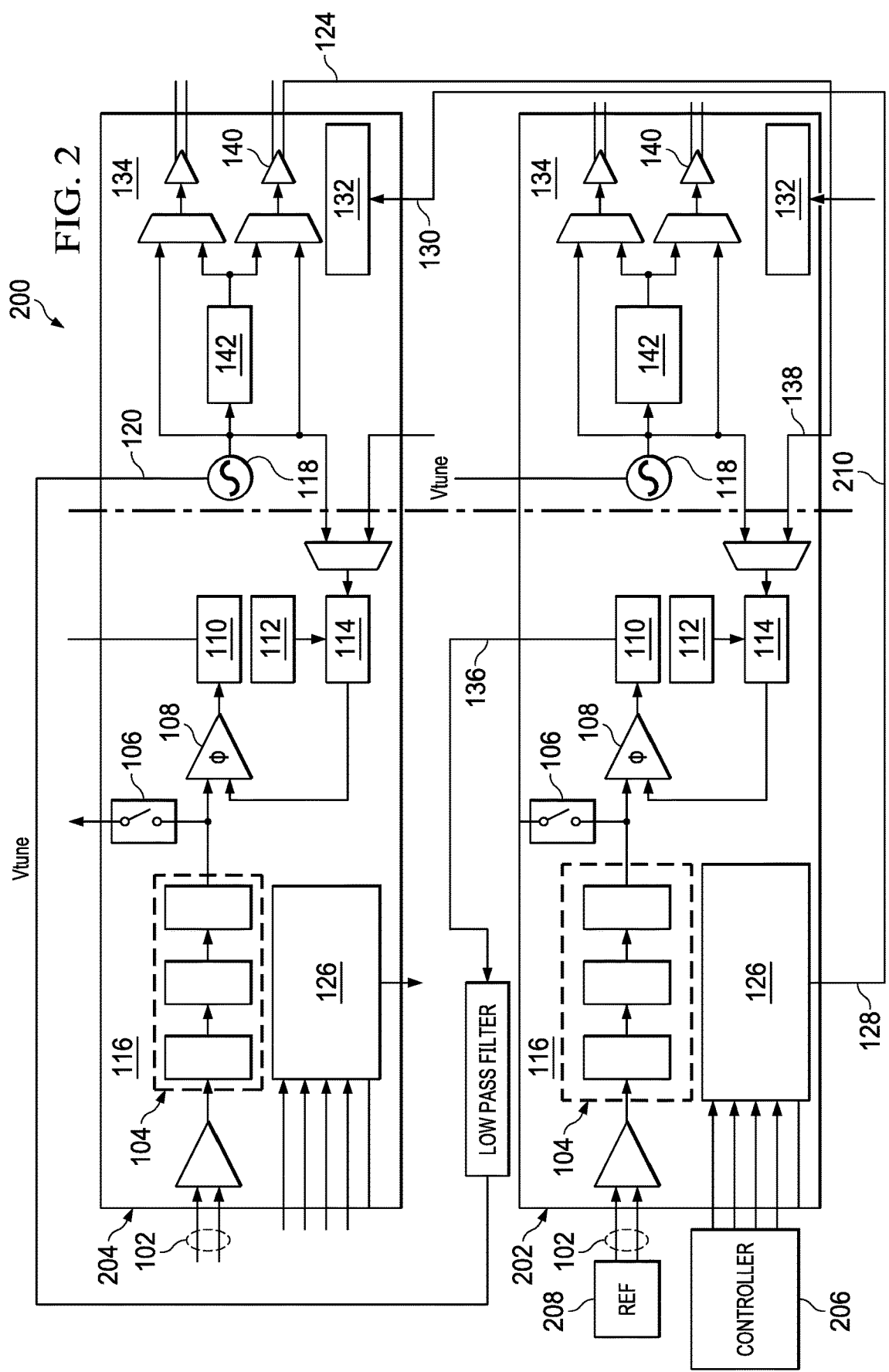
FIG. 2 shows a block diagram for a PLL based oscillator circuit implemented with two instances of a PLL/VCO integrated circuit configured for automatic digital VCO calibration in accordance with various examples.

FIG. 2 shows a block diagram for a PLL based oscillator circuit 200 implemented with two instances of a PLL/VCO integrated circuit 100 configured for automatic digital VCO calibration in accordance with various examples. To facilitate explanation, in the PLL based oscillator circuit 200, a first instance of the PLL/VCO integrated circuit 100 is identified as PLL/VCO integrated circuit 202, and second instance of the PLL/VCO integrated circuit 100 is identified as PLL/VCO integrated circuit PLL/VCO integrated circuit 204. In the PLL based oscillator circuit 200, the PLL circuitry 116 of the PLL/VCO integrated circuit 202 provides PLL functionality, the interface circuitry 126 of the PLL/VCO integrated circuit 202 provides communication interface functionality, and the VCO circuitry 134 of the PLL/VCO integrated circuit 204 provides VCO functionality. The VCO circuitry 134 of the PLL/VCO integrated circuit 202 is not used in the PLL based oscillator circuit 200. In the PLL/VCO integrated circuit 204, the PLL circuitry 116 not used to control the VCO 118. The interface circuitry 126 of the PLL/VCO integrated circuit 204 is not used.

The PLL based oscillator circuit 200 minimizes the interconnections between the two PLL based oscillator circuits. The calibration control output terminal 128 of the PLL/VCO integrated circuit 202 is connected to the calibration I/O terminal 130 of the PLL/VCO integrated circuit 204 to form a digital communication link 210 that enables digital communication between the PLL/VCO integrated circuit 202 and PLL/VCO integrated circuit 204. The PLL/VCO integrated circuit 202 does not provide a reference oscillator signal to the PLL/VCO integrated circuit 204, and the reference signal output terminal 122 of the PLL/VCO integrated circuit 202 is not connected to the reference signal input terminal 102 of the PLL/VCO integrated circuit 204. The charge pump output terminal 136 of the PLL/VCO integrated circuit 202 is coupled to the VCO control voltage input terminal 120 of the PLL/VCO integrated circuit 204 to provide the control voltage generated by the charge pump 110 of the PLL/VCO integrated circuit 202 to the VCO 118 of the PLL/VCO integrated circuit 204. The VCO output terminal 124 of the PLL/VCO integrated circuit 204 is connected to the feedback input terminal 138 of the PLL/VCO integrated circuit 202 to provide the output of the VCO 118 as feedback to the PLL circuitry 116 of the PLL/VCO integrated circuit 202.

In the PLL based oscillator circuit 200, a controller 206 (e.g., a microcontroller) is coupled to the interface circuitry 126 of the PLL/VCO integrated circuit 202, and a reference signal source 208 (e.g., a reference oscillator) is coupled to the reference signal input terminal 102 of the PLL/VCO integrated circuit 202. To operate the PLL based oscillator circuit 200, the controller 206 communicates with the PLL/VCO integrated circuit 202, via the interface circuitry 126, and sets the PLL/VCO integrated circuit 202 to operate in digital master mode. Setting the PLL/VCO integrated circuit 202 to operate in digital master mode includes triggering the PLL/VCO integrated circuit 202 to communicate with the PLL/VCO integrated circuit 204 via the digital communication link 210, which places the PLL/VCO integrated circuit 204 in slave mode. In some implementations, setting the PLL/VCO integrated circuit 202 to operate in digital master mode includes switching power to the various functional blocks of the PLL/VCO integrated circuit 202 and the PLL/VCO integrated circuit 204 as needed for operation in the digital master mode. For example, in the PLL/VCO integrated circuit 202, the circuitry of the PLL circuitry 116 (except the calibration reference switch 106) is powered on, and the circuitry of the VCO circuitry 134 is powered off. In the PLL/VCO integrated circuit 204, the circuitry of the VCO circuitry 134 is powered on and the circuitry of the PLL circuitry 116 is powered off.

To calibrate the VCO 118 of the PLL/VCO integrated circuit 204, configuration information, provided by the controller 206, is received by the interface circuitry 126 of the PLL/VCO integrated circuit 202. The configuration information includes the various setting to be applied to the circuitry of the PLL circuitry 116, such as settings of the reference frequency divider circuit 104, the charge pump 110, the delta-sigma modulator 112, and the feedback divider 114, and also includes setting of the channel divider 142 of the PLL/VCO integrated circuit 204. The PLL/VCO integrated circuit 202 passes configuration information to the PLL/VCO integrated circuit 204 via the digital communication link 210. The controller 206 initiates calibration of the VCO 118 via the interface circuitry 126.

In automatic digital VCO calibration, the PLL/VCO integrated circuit 202 controls calibration of the VCO 118 of the PLL/VCO integrated circuit 204 via the digital communication link 210. To calibrate the VCO 118 of the PLL/VCO integrated circuit 204, the PLL/VCO integrated circuit 202 selects each of a plurality of VCOs (e.g., each VCO of the plurality of VCOs with coarse adjustment applied) of the VCO 118 to generate an output signal and compares the output of the VCO 118 to the output of the reference signal source 208 in the PLL circuitry 116 of the PLL/VCO integrated circuit 202. For example, a given VCO of the plurality of VCOs with a center frequency closest to the output frequency of the reference signal source 208 is selected for use. During VCO calibration, the VCO 118 of the PLL/VCO integrated circuit 204 is disconnected from the charge pump 110 of the PLL/VCO integrated circuit 202 so that the frequency of the selected VCO is not affected by control voltage generated by the charge pump 110 of the PLL/VCO integrated circuit 202. The VCO 118 of the PLL/VCO integrated circuit 204 includes an array of capacitors having different values of capacitance. The PLL/VCO integrated circuit 202 connects different ones of the capacitors to the given VCO and the resulting VCO output frequency is compared, by the PLL circuitry 116 of the PLL/VCO integrated circuit 202, to the output frequency of the reference signal source 208. The PLL/VCO integrated circuit 202 ultimately selects the capacitor that produces the best match in output frequency of the VCO 118 of the PLL/VCO integrated circuit 204 and the reference frequency received from the reference signal source 208. The PLL/VCO integrated circuit 202 also adjusts the amplitude of the output of the VCO 118 of the PLL/VCO integrated circuit 204 to a predetermined voltage.

When calibration of the VCO 118 is complete, the PLL/VCO integrated circuit 202 connects the VCO 118 of the PLL/VCO integrated circuit 204 to the charge pump output terminal 136 of the PLL/VCO integrated circuit 202, thereby allowing the PLL circuitry 116 of the PLL/VCO integrated circuit 202 to control the frequency of the VCO 118 of the PLL/VCO integrated circuit 204.

By implementing the PLL based oscillator circuit 200 using two instances of the PLL/VCO integrated circuit 100, the PLL based oscillator circuit 200 isolates the PLL circuitry 116 from the VCO circuitry 134 and reduces the incidence of spurious tones in the output of the VCO 118. Communication between the PLL/VCO integrated circuit 202 and the PLL/VCO integrated circuit 204, allows the PLL/VCO integrated circuit 202 to calibrate the VCO 118 of the PLL/VCO integrated circuit 204 in a manner similar to a single integrated circuit implementation, thereby reducing the cost of implementation of the PLL based oscillator circuit 200.

Figure 3:
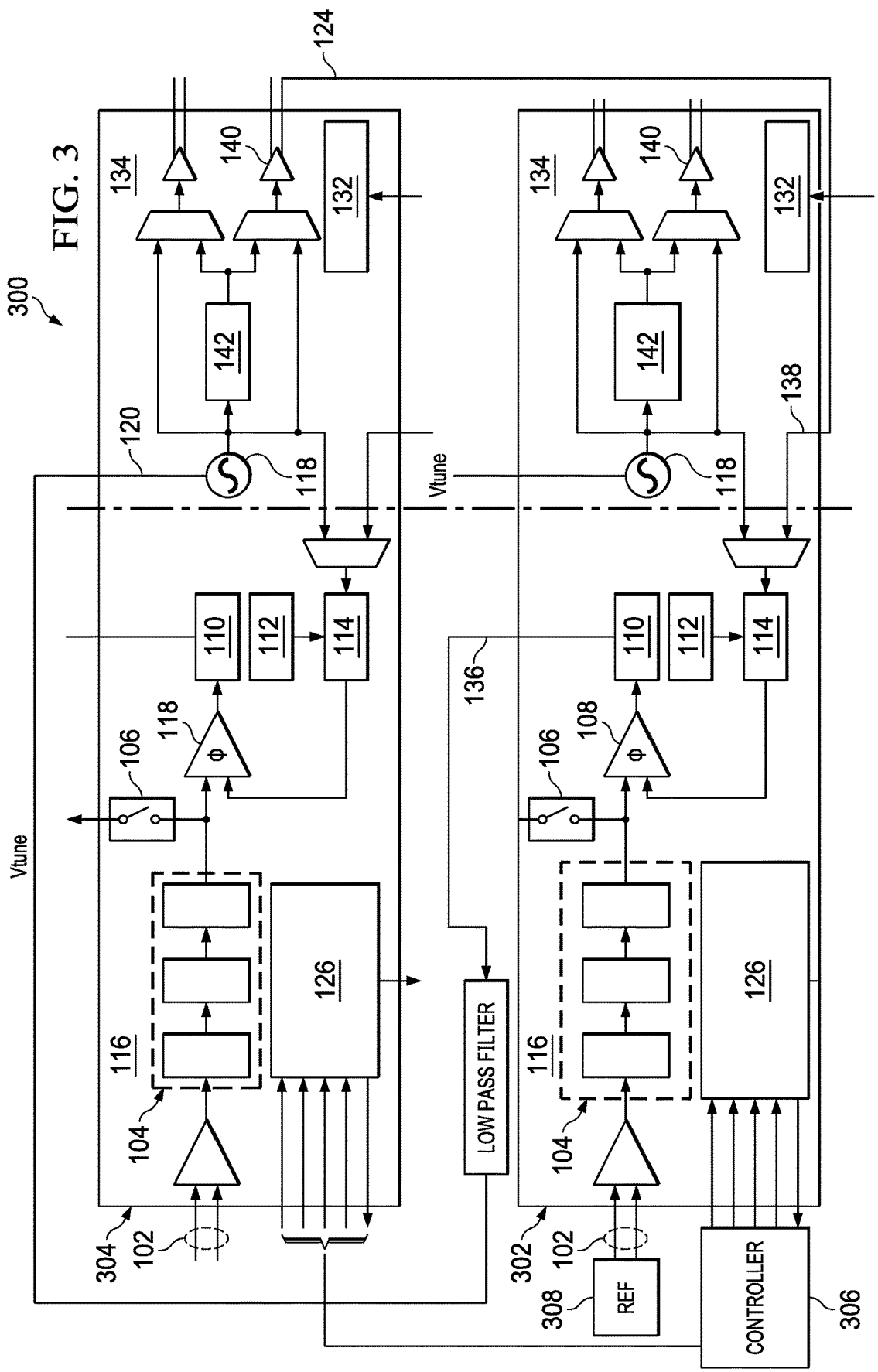
FIG. 3 shows a block diagram for a PLL based oscillator circuit implemented with two instances of a PLL/VCO integrated circuit configured for external analog VCO calibration in accordance with various examples.

FIG. 3 shows a block diagram for a PLL based oscillator circuit 300 implemented with two instances of a PLL/VCO integrated circuit 100 configured for external analog VCO calibration in accordance with various examples. To facilitate explanation, in the PLL based oscillator circuit 300, a first instance of the PLL/VCO integrated circuit 100 is identified as PLL/VCO integrated circuit 302, and second instance of the PLL/VCO integrated circuit 100 is identified as PLL/VCO integrated circuit PLL/VCO integrated circuit 304. In the PLL based oscillator circuit 300, the PLL circuitry 116 of the PLL/VCO integrated circuit 302 provides PLL functionality, and the VCO circuitry 134 of the PLL/VCO integrated circuit 304 provides VCO functionality. The VCO circuitry 134 of the PLL/VCO integrated circuit 302 not used. The PLL circuitry 116 of the PLL/VCO integrated circuit 304 is used for calibration but not for operation in the PLL based oscillator circuit 300. In the PLL based oscillator circuit 300 a digital communication link between the PLL/VCO integrated circuit 302 and the PLL/VCO integrated circuit 304 is not provided.

The PLL/VCO integrated circuit 302 provides a reference signal to the PLL/VCO integrated circuit 304, and the reference signal output terminal 122 of the PLL/VCO integrated circuit 302 is connected to the reference signal input terminal 102 of the PLL/VCO integrated circuit 304. The charge pump output terminal 136 of the PLL/VCO integrated circuit 302 is coupled to the VCO control voltage input terminal 120 of the PLL/VCO integrated circuit 304 to provide the control voltage generated by the charge pump 110 of the PLL/VCO integrated circuit 302 to the VCO 118 of the PLL/VCO integrated circuit 304. The VCO output terminal 124 of the PLL/VCO integrated circuit 304 is connected to the feedback input terminal 138 of the PLL/VCO integrated circuit 302 to provide the output of the VCO 118 as feedback to the PLL circuitry 116 of the PLL/VCO integrated circuit 302.

In the PLL based oscillator circuit 300, a controller 306 (e.g., a microcontroller) is coupled to the interface circuitry 126 of the PLL/VCO integrated circuit 302 and to the interface circuitry 126 of the PLL/VCO integrated circuit 304. A reference signal source 308 (e.g., a reference oscillator) is coupled to the reference signal input terminal 102 of the PLL/VCO integrated circuit 302. To operate the PLL based oscillator circuit 300, the controller 306 communicates with the PLL/VCO integrated circuit 302 and the PLL/VCO integrated circuit 304, via the corresponding interface circuitry 126, and sets the PLL circuitry 116 of the PLL/VCO integrated circuit 302, the PLL circuitry 116 of the PLL/VCO integrated circuit 304, and the VCO circuitry 134 of the PLL/VCO integrated circuit 304. The controller 306 provides configuration settings for the reference frequency divider circuit 104, the charge pump 110, the delta-sigma modulator 112, and the feedback divider 114 of the PLL/VCO integrated circuit 302. The controller 306 provides configuration settings that are the same as those provided to the PLL/VCO integrated circuit 302 to the PLL/VCO integrated circuit 304. However, the reference frequency divider circuit 104 of the PLL/VCO integrated circuit 304 is set to divide by one so that the reference frequency received from the PLL/VCO integrated circuit 302 is not further divided. The controller 306 also sets the channel divider 142 of the PLL/VCO integrated circuit 304.

In some implementations of the PLL based oscillator circuit 300, configuring the PLL/VCO integrated circuit 302 and the PLL/VCO integrated circuit 304 includes switching power to the various functional blocks of the PLL/VCO integrated circuit 302 and the PLL/VCO integrated circuit 304 as needed for operation. For example, in the PLL/VCO integrated circuit 302, the PLL circuitry 116 is powered on, and the VCO circuitry 134 is powered off. In the PLL/VCO integrated circuit 304, the VCO circuitry 134 and the PLL circuitry 116 are powered on, with the possible exception of the calibration circuitry 132 and the calibration reference switch 106 which are powered off. The controller 306 powers the various circuits on or off via the interface circuitry 126 of the respective integrated circuit.

In the PLL based oscillator circuit 300, the controller 306 controls the calibration of the VCO 118 in the PLL/VCO integrated circuit 304. To initiate calibration of the VCO 118 of the PLL/VCO integrated circuit 304, the controller 306 closes the calibration reference switch 106 the PLL/VCO integrated circuit 302 to connect the reference signal input terminal 102 of the PLL/VCO integrated circuit 304 to the output of the reference frequency divider circuit 104 of the PLL/VCO integrated circuit 302, thereby providing the reference frequency at the output of the reference frequency divider circuit 104 of the PLL/VCO integrated circuit 302 to the PLL/VCO integrated circuit 304. To calibrate the VCO 118 of the PLL/VCO integrated circuit 304, the controller 306 selects each of a plurality of VCOs of the VCO 118 to generate an output signal and monitors the comparison of the output of the VCO 118 to the output of the reference frequency divider circuit 104 in the PLL circuitry 116 of the PLL/VCO integrated circuit 304. For example, a given VCO of the plurality of VCOs with a center frequency closest to the output of the reference frequency divider circuit 104 is selected for use. During calibration of the selected VCO, the VCO 118 of the PLL/VCO integrated circuit 304 is disconnected from the charge pump 110 of the PLL/VCO integrated circuit 302 so that the frequency of the selected VCO is not affected by control voltage generated by the charge pump 110 of the PLL/VCO integrated circuit 302. The VCO 118 of the PLL/VCO integrated circuit 304 includes an array of capacitors having different values of capacitance. The PLL/VCO integrated circuit 302 connects different ones of the capacitors to the given VCO and the resulting VCO output frequency is compared, in the PLL circuitry 116 of the PLL/VCO integrated circuit 202, to the output of the reference frequency divider circuit 104. The controller 306 ultimately selects the capacitor that produces the best match in output frequency of the VCO 118 of the PLL/VCO integrated circuit 204 and the output of the reference frequency divider circuit 104. The controller 306 also adjusts the amplitude of the output of the VCO 118 of the PLL/VCO integrated circuit 304 to a predetermined voltage.

When calibration of the VCO 118 is complete, the controller 306 causes the PLL/VCO integrated circuit 302 to open the calibration reference switch 106, thereby disconnecting the reference signal input terminal 102 of the PLL/VCO integrated circuit 304 from the output of the reference frequency divider circuit 104 of the PLL/VCO integrated circuit 302. The controller 306 also connects the VCO 118 of the PLL/VCO integrated circuit 304 to the charge pump output terminal 136 of the PLL/VCO integrated circuit 302, thereby allowing the PLL circuitry 116 of the PLL/VCO integrated circuit 302 to control the frequency of the VCO 118 of the PLL/VCO integrated circuit 304.

By implementing the PLL based oscillator circuit 300 using two instances of the PLL/VCO integrated circuit 100, the PLL based oscillator circuit 300 isolates the PLL circuitry 116 from the VCO circuitry 134 and reduces the incidence of spurious tones in the output of the VCO 118. The calibration reference switch 106 allows reference signal provided by the PLL/VCO integrated circuit 302 to be connected to the PLL/VCO integrated circuit 304 for calibration and disconnected for normal operation without requiring additional components, thereby reducing the cost of implementation of the PLL based oscillator circuit 300.

In a variation of the PLL based oscillator circuit 300, a digital communication link 210 is provided between the PLL/VCO integrated circuit 302 and the PLL/VCO integrated circuit 304, and the controller 306 is connected only to the PLL/VCO integrated circuit 302. In such implementations, the interface circuitry 126 of the PLL/VCO integrated circuit 302 is coupled to the calibration circuitry 132 of the PLL/VCO integrated circuit 304. Circuit settings are passed from the PLL/VCO integrated circuit 302 to the PLL/VCO integrated circuit 304 via the digital communication link 210, reference signal is passed from the PLL/VCO integrated circuit 302 to the PLL/VCO integrated circuit 304 via the calibration reference switch 106 of the PLL/VCO integrated circuit 302, and automatic calibration of the VCO 118 of the PLL/VCO integrated circuit 304 is controlled by the calibration circuitry 132 of the PLL/VCO integrated circuit 304 based on the output of the PLL circuitry 116 of the PLL/VCO integrated circuit 304.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
   phase locked loop (PLL) circuitry including:
   a reference signal input terminal coupled to a buffer circuit having an output;
   a reference frequency divider circuit having an input coupled to the output of the buffer circuit and an output;
   a reference signal output terminal;
   a switch having a first terminal coupled to the output of the reference frequency divider circuit and a second terminal coupled to the reference signal output terminal, the switch configured to connect and disconnect the reference frequency divider circuit to the reference signal output terminal;
   a phase detector having a first input coupled to the reference frequency divider circuit, a second input coupled to a feedback signal, and an output;
   a charge pump having an input and an output, wherein the input is coupled to the output of the phase detector; and
   a control voltage output terminal coupled to the output of the charge pump;
   voltage controlled oscillator (VCO) circuitry including:
   a control voltage input terminal configured to receive an input from an external device;

a VCO having first and second inputs wherein the first input is coupled to the control voltage input terminal;

calibration circuitry having an input and having an output coupled to the VCO that includes capacitor selection signals for selecting one or more capacitors from a capacitor bank for connection to the VCO; and a calibration input/output (I/O) terminal coupled to the calibration circuitry; and interface circuitry having a calibration control output terminal.

2. The integrated circuit of claim 1, wherein the switch is coupled to the interface circuitry, and the interface circuitry is configured to close the switch connecting the reference frequency divider circuit to the reference signal output terminal during calibration of the VCO circuitry.

3. The integrated circuit of claim 2, wherein the interface circuitry is configured to open the switch responsive to completion of calibration of the VCO circuitry disconnecting the reference frequency divider circuit from the reference signal output terminal.

4. The integrated circuit of claim 1, wherein the VCO circuitry includes a plurality of VCOs, and the calibration circuitry is configured to select at least one VCO of the plurality of VCOs for use based on a comparison of an output of the VCO circuitry to a reference frequency by the PLL circuitry.

5. The integrated circuit of claim 1, wherein the calibration circuitry is configured to select the capacitance values to apply to the VCO based on a comparison of an output of the VCO circuitry to a reference frequency by the PLL circuitry.

6. The integrated circuit of claim 1, wherein the calibration circuitry is configured to provide configuration information received via the calibration I/O terminal to the PLL circuitry.

7. The integrated circuit of claim 1, wherein the interface circuitry is configured to communicate digitally with an external controller and to communicate digitally with the calibration circuitry of a different instance of the integrated circuit.

8. An oscillator system, comprising:
a first integrated circuit; and
a second integrated circuit, wherein the second integrated circuit and the first integrated circuit comprise a same circuitry;
wherein each of the first integrated circuit and the second integrated circuit includes:
phase locked loop (PLL) circuitry;
voltage controlled oscillator (VCO) circuitry; and
interface circuitry;
wherein the PLL circuitry includes:
a reference signal input terminal coupled to a buffer circuit having an output;
a reference frequency divider circuit having an input coupled to the output of the buffer circuit and having an output;
a reference signal output terminal;
a switch having a first terminal coupled to the output of the reference frequency divider circuit and a second terminal coupled to the reference signal output terminal, the switch configured to connect and disconnect the reference frequency divider circuit to the reference signal output terminal;

a feedback frequency divider circuit having an output, wherein the frequency divider circuit is coupled to a modulator adapted to change the frequency divisor;

a phase detector having a first input coupled to the reference frequency divider circuit, a second input coupled to the output of the feedback frequency divider, and an output;

a charge pump having an input and an output, wherein the input is coupled to the output of the phase detector; and a control voltage output terminal coupled to the output of the charge pump;

the PLL circuitry of the first integrated circuit is coupled to the VCO circuitry of the second integrated circuit;

the VCO circuitry includes a control voltage input terminal configured to receive an input from an external device; and the interface circuitry of the first integrated circuit controls calibration of the VCO circuitry of the second integrated circuit.

9. The oscillator system of claim 8, wherein the interface circuitry of the first integrated circuit is configured to control the calibration of the VCO circuitry of the second integrated circuit based on a comparison of an output of the VCO circuitry of the second integrated circuit to a reference frequency by the PLL circuitry of the first integrated circuit.

10. The oscillator system of claim 8, wherein the VCO circuitry of the second integrated circuit includes more than one VCO, and the interface circuitry of the first integrated circuit is configured to select one of the VCOs for use based on a comparison of an output of each of the VCOs to a reference frequency by the PLL circuitry of the first integrated circuit.

11. The oscillator system of claim 8, wherein the VCO circuitry includes more than one capacitance value and the interface circuitry of the first integrated circuit is configured to select capacitance values to apply in the VCO circuitry based on a comparison of an output of the VCO circuitry produced using each of the capacitance values to a reference frequency by the PLL circuitry of the first integrated circuit.

12. The oscillator system of claim 8, wherein the voltage controlled oscillator (VCO) circuitry includes:
a control voltage input terminal;
a VCO coupled to the control voltage input terminal;
calibration circuitry coupled to the voltage controlled oscillator; and
a calibration input/output (I/O) terminal coupled to the calibration circuitry.

13. The oscillator system of claim 12,
wherein the interface circuitry of the first integrated circuit includes a calibration control output terminal; and
wherein the calibration control output terminal of the first integrated circuit is connected to the calibration I/O terminal of the second integrated circuit.

* * * * *